US006703712B2

(12) United States Patent
Gilkes et al.

(10) Patent No.: US 6,703,712 B2
(45) Date of Patent: Mar. 9, 2004

(54) MICROELECTRONIC DEVICE LAYER DEPOSITED WITH MULTIPLE ELECTROLYTES

(75) Inventors: Daniele Gilkes, Pompano Beach, FL (US); Minseok Oh, Orlando, FL (US); Sailesh M. Merchant, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 18 days.

(21) Appl. No.: 10/008,015

(22) Filed: Nov. 13, 2001

(65) Prior Publication Data

US 2003/0089986 A1 May 15, 2003

(51) Int. Cl.⁷ .......................... H01L 23/48; H01L 23/52
(52) U.S. Cl. ....................... 257/762; 257/751; 257/773; 257/775
(58) Field of Search ................................. 257/751–753, 257/758, 759, 761–764, 767, 773–775; 438/433, 440, 447, 449, 514, 542, 549, 633

(56) References Cited

U.S. PATENT DOCUMENTS

| 4,835,008 | A | | 5/1989 | DiStefano |
| 4,909,913 | A | | 3/1990 | Fukuda et al. |
| 5,847,463 | A | | 12/1998 | Trivedi et al. |
| 5,933,758 | A | | 8/1999 | Jain |
| 6,093,647 | A | | 7/2000 | Yu et al. |
| 6,130,161 | A | * | 10/2000 | Ashley et al. ............... 438/687 |
| 6,165,912 | A | | 12/2000 | McConnell et al. |

* cited by examiner

*Primary Examiner*—Hung Vu
(74) *Attorney, Agent, or Firm*—David G. Maire; Beusse Brownlee Wolter Mora & Maire. P.A.

(57) ABSTRACT

A microelectronic device (24) is formed by plating a layer of material (36) to fill a cavity (28) formed in a substrate (26). The layer of material has a plurality of regions (42, 44, 46) with respective chemical compositions formed by varying the chemical composition of the plating solution as the layer of material is being deposited. In this manner, expensive additives necessary to achieve desired properties within the cavity may be omitted from the region (46) of overfill that will be removed by a later planarization process.

12 Claims, 4 Drawing Sheets

MICROELECTRONIC DEVICE LAYER DEPOSITED WITH MULTIPLE ELECTROLYTES

FIELD OF THE INVENTION

The present invention relates generally to the field of microelectronic device fabrication, and more particularly to the deposition of metal onto a semiconductor wafer, and specifically to the electroplating of copper into a cavity formed on a semiconductor wafer.

BACKGROUND OF THE INVENTION

Electroplating of metals is a well known technology that has recently become more widely used in the manufacture of microelectronic devices such as integrated circuits formed on semiconductor wafers. Electroplating provides a higher deposition rate than thermal deposition processes such as chemical vapor deposition (CVD), physical vapor deposition (PVD) or sputtering, and will do so at a significantly lower temperature. As a result, electroplating is a relatively low cost process for material deposition.

Electroplating involves the immersion of a surface to be plated into a solution containing ions of the metal to be deposited. An electrical charge is applied between the solution and the surface, and the metal ions are attracted to the surface where they are reduced to a metal which then plates out onto the surface. For the deposition of copper on a semiconductor wafer surface, the solution may contain, among others, copper sulfate ($CuSO_4$), sulfuric acid ($H_2SO_4$), other additives and water. The cupper sulfate will break down in this acid solution to form constituent ions. The semiconductor wafer surface is prepared by the deposition of an adhesion/barrier layer and a seed layer. The adhesion/barrier layer may be tantalum, tantalum nitride or other refractory metallic film. The function of the seed layer is to provide a material on which a subsequently deposited material will readily form. The seed layer may be a thin layer (approximately 100 nm) of copper or other suitable material known in the art and applied by PVD or other process known in the art. The wafer and prepared surface are brought in contact with a bath containing the solution, an electrical charge is applied and copper is deposited.

FIG. 1 illustrates a prior art semiconductor device 10 having a layer of copper 12 deposited on a silicon wafer 14. The device 10 includes a barrier layer 16 and a seed layer 18 deposited on the wafer 14 prior to the electro-deposition of the copper layer 12. Prior to the deposition of the various layers 16, 18, 12, there was formed a cavity 20, such as a trench, via or dual damascene structure, in the top surface of the wafer 14. One may appreciate that the cavity 20 may be formed directly into the silicon wafer 14 or into one or more layers of dielectric or other materials formed over the silicon, depending upon the requirements of the particular application. The layer of copper 12 may be approximately 0.5–2.5 microns in thickness, while the depth of the cavity 20 may vary from about 0.1 micron to about 1.5 micron. The top portion of the deposited copper is removed by a chemical mechanical polishing (CMP) process or other planarization method to form the final device 22 as illustrated in FIG. 2. The extra depth of copper is deposited to ensure a full fill in the cavity 20 and to provide sufficient material to ensure that a planar surface can be obtained via the planarization process.

One may appreciate that as the depth/width ratio of cavity 20 increases, it becomes increasingly more difficult to ensure that the fill metal is deposited throughout the entire volume of the cavity 20. Certain additives are commonly used with the electrolyte solution to facilitate a complete bottom-up fill of cavity 20 and/or to provide desired mechanical properties to the as-deposited metal. While the cost of a plating process may be less than alternative thermal deposition processes, the cost of the additives used in the plating solution can be significant.

With the demand for microelectronics products being directly responsive to their price in the marketplace, there is continuing pressure to reduce the cost of manufacturing of these devices. Accordingly, a less costly electroplating process is needed.

BRIEF SUMMARY OF THE INVENTION

A microelectronic device is described at a stage of fabrication as including: a substrate having a surface; a layer of a metal plated onto the substrate surface; and a first region of the layer of metal having a first chemical composition and a second region of the layer of metal plated over the first region and having a second chemical composition different from the first chemical composition. The layer of metal may include a metal and an additive, and wherein the concentration of the additive varies across a depth of the layer of metal. The metal may be copper and the additive may be at least one of the group of a carrier, a leveler and a surfactant. The device may further include: the substrate having a surface with a generally planar field area and a cavity formed therein; and the first region extending from the substrate surface to a level at least filling the cavity.

A process for fabricating a microelectronic device is described herein as including: depositing a layer of material on a surface of a semiconductor wafer by contacting the surface with a plating solution; and changing the chemical composition of the plating solution during the step of depositing so that the deposited layer of material comprises a plurality of regions each having a different chemical composition. The process may further include: forming a cavity on the surface of the semiconductor wafer prior to the step of depositing; and changing the chemical composition of the plating solution after the deposited layer of material has been deposited to a predetermined thickness in the cavity.

A process for fabricating a microelectronic device, the process comprising: depositing a first region of a layer of material on a surface of a semiconductor wafer in a first plating cell by contacting the surface of the semiconductor wafer with a first plating solution having a first chemical composition; and depositing a second region of the layer of material on the first region in a second plating cell by contacting a surface of the first region with a second plating solution having a second chemical composition different from the first chemical composition.

A device for depositing a layer of metal having a plurality of regions with distinct chemical compositions is described as including: a first solution tank and a second solution tank for containing respective first and second plating solutions having distinct chemical compositions; and a bath connected to the first solution tank and to the second solution tank for receiving consecutive volumes of the first and second plating solutions.

A device for depositing a layer of metal having a plurality of regions with distinct chemical compositions is further described as including: a first bath for containing a first plating solution having a first chemical composition; a second bath for containing a second plating solution having a second chemical composition different than the first chemical composition; and a handling tool for moving a wafer from the first bath to the second bath.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
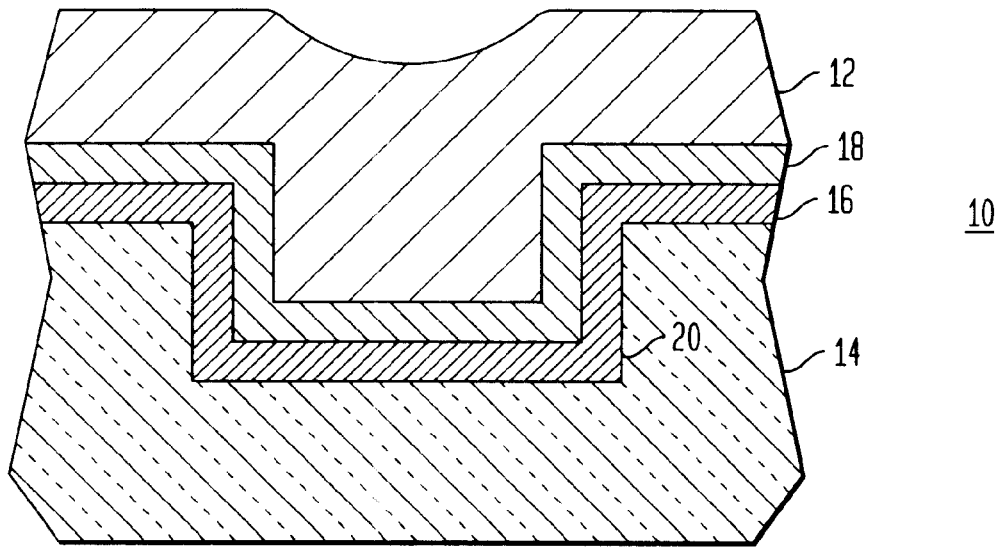
FIG. 1 is a partial cross-sectional view of a prior art semiconductor device during a stage of fabrication wherein a cavity has been over-filled with a layer of copper deposited by electroplating.
Figure 2:
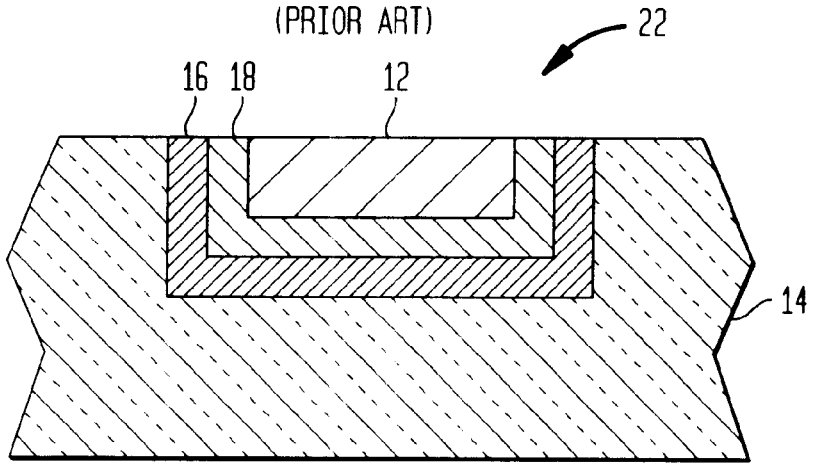
FIG. 2 is the device of FIG. 1 after being subjected to a chemical mechanical polishing process for the removal of a top portion of the layer of copper.
Figure 3:
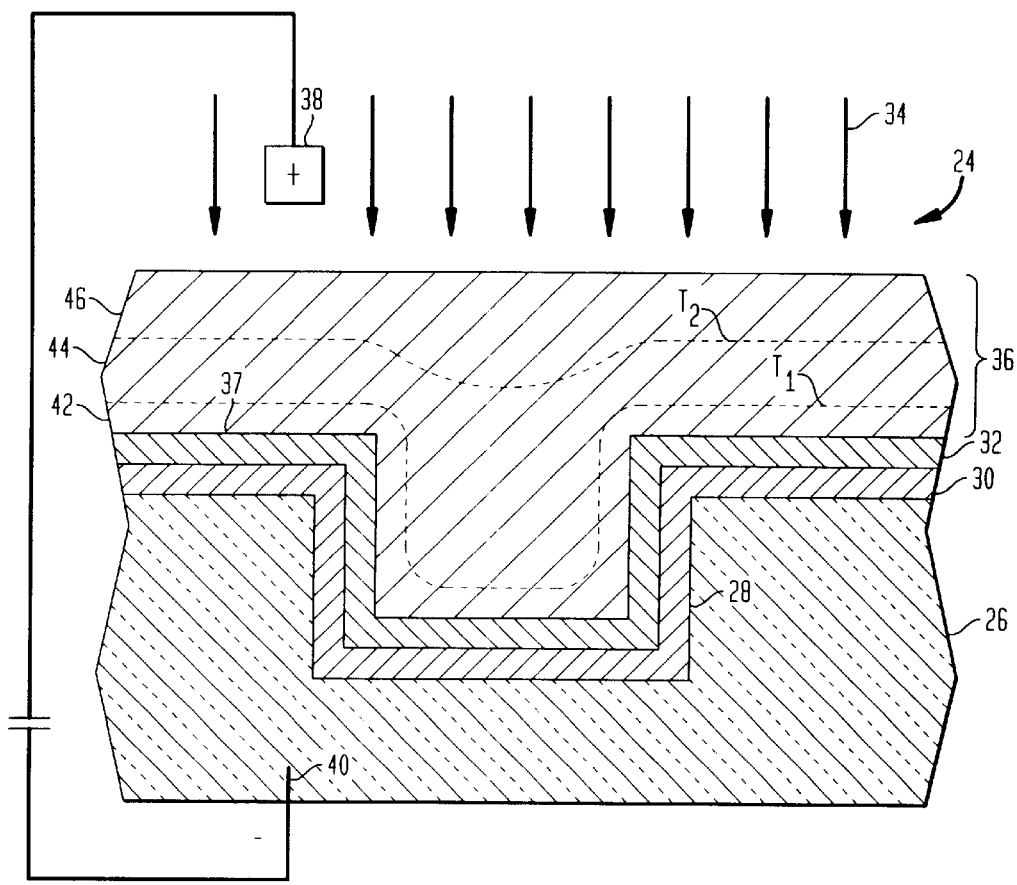
FIG. 3 is a partial cross-sectional view of a semiconductor device during a stage of fabrication wherein a cavity has been over-filled with copper deposited in multiple layers, each layer having a different chemistry.

A method of filling a cavity such as a trench or via or dual damascene structure with a conductive material in accordance with the present invention is described with reference to a resulting structure illustrated in partial cross-sectional view in FIG. 3. A portion 24 of a semiconductor device is illustrated in FIG. 3. Layer 26 may be a portion of a semiconductor wafer or a layer of dielectric or other material deposited on such a wafer. A cavity 28 such as a via or trench has been formed in the layer 26 by any process known in the art, such as by a selective etching process. A barrier layer 30 has been formed on the surface of layer 26 including the surfaces of cavity 28. The barrier layer 30 may be a film of tantalum, tantalum nitride, other refractory metal or other known material. A seed layer 32 has been formed on the surface of barrier layer 30 in order to form a layer of material on which a layer of material will form in a subsequent electroplating process. For a subsequent copper layer, the seed layer 32 may be copper or other suitable material known in the art. Both the barrier layer 30 and the seed layer 32 may be deposited by processes known in the art, such as PVD, CVD or sputtering, for example. While the barrier layer 30 and seed layer 32 are commonly used in semiconductor conductor and interconnect fabrication, one may appreciate that one or both of these layers may be omitted in certain applications.

FIG. 3 illustrates the semiconductor wafer portion 24 in contact with an electrolyte or electroplating solution 34 for the deposition of a layer 36 of metal such as copper, nickel, lead, tin and/or gold. The layer 36 fills the cavity 28 and extends to a desired level of overfill above the level of the generally planar field area 37 to provide sufficient material for a subsequent planarization process, such as a chemical mechanical polishing process. An anode 38 is placed in the electroplating solution 34 and a cathode 40 is attached to the wafer such as at layer 26. The layer 36 is formed as metal ions in the electroplating solution 34 are attracted to and plate onto the negatively charged surface of the seed layer 32, with the thickness of the layer 36 being a function of plating parameters such as plating time, current density, bath concentration, etc. Time lines $T_1$ and $T_2$ indicate points in time during the electroplating process when the chemistry of the electroplating solution 34 was changed, resulting in a different chemistry in each of a plurality of regions 42, 44, 46 of layer 36. For a layer 36 intended as a precursor structure for a copper conductor in cavity 28, the bulk material of layer 36 may be copper with each of the plurality of regions 42, 44, 46 including small amounts of various additives that were included in the electroplating solution 34 for various reasons.

Many known electroplating processes incorporate one or more of three types of additives in the electrolyte bath: a carrier, a leveler and a brightener. Carriers are large molecular weight polymers, levelers are surfactants and are usually amine-based, and brighteners are typically acids that have active sulfur groups. Such additives are commercially available, and they include the family of such additives sold by Enthone, Inc. (www.enthone.com) under the trademark CuBath. In one embodiment of the present invention, a first region 42 of copper layer 36 may include an additive used to ensure a complete fill into cavity 28. A second region 44 may include a dopant known to migrate to the copper grain boundaries upon subsequent thermal processing, thereby pinning the grain boundaries and providing a desired level of strength to the material. A third region 46 may include a surfactant or a brightener.

Alternatively, a first region 42, 44 may be formed using an electroplating solution 34 containing an additive, while a subsequently deposited region 46 does not contain the additive. This embodiment is especially useful if the additive adds significantly to the cost of the electroplating process. The expensive additive may be used for only the region where the particular benefit that it imparts has value. In other regions, the additive is omitted. Such additive may be included in any one or more of the regions 42, 44, 46, depending upon the requirements of the particular application. For high aspect ratio cavities, it is common to use additives that ensure good fill qualities, provide strength to the grain boundaries, and provide a shining surface finish. These features are not needed on the overburden portion of the deposited layer once the cavity has been filled beyond its final, as-planarized, depth. Accordingly, in one embodiment, additives are provided in the electrolyte 34 for a period $T_2$ until the cavity 28 is filled, then no such additives or a lower concentration of such additives are provided for a time period after $T_2$. Thus, the region 42, 44 at least filling the cavity 28 has a chemical composition distinct from a region 46 plated over and disposed above the region 42, 44.

Commercial electroplating equipment is available from many vendors, including Applied Materials, Inc. (www.appliedmaterials.com), Novellus Systems, Inc. (www.novellus.com), Semitool, Inc. (www.semitool.com), and NuTool, Inc. (www.nutool.com). The change in chemistry between regions 42, 44, 46 may be accomplished by completely draining and refilling the electroplating solution 34 from a single plating cell. Alternatively, the semiconductor device may be moved from one plating cell to another so that a first region 42 is applied in a first plating cell, with one or more further regions 44, 46 being applied in a respective different plating cell having an electrolyte with a different chemistry. A cleaning step may be applied to the top surface of layer 36 prior to beginning the subsequent plating processes. Alternatively, in order to avoid the formation of corrosion products between regions and in order to provide for a more gradual transition of chemistries between regions, it may be preferable that a single plating solution 34 with a changing chemical composition be used. Existing electroplating equipment may have to be modified to accommodate a change in the electroplating solution 34 at times $T_1$ and $T_2$. The dispensing and run-off systems may be modified to permit the chemistry of the solution 34 to be conveniently changed without interrupting the plating process. In one embodiment, an additive is provided in the electroplating solution 34 at a first concentration during the deposition of an initial region 42 of layer 36, and the concentration of the additive is reduced to essentially zero for a second region 46. The additive may be actively removed by filtering or flushing of the solution 34, or the additive may be reduced passively by not being replenished as the plating process progresses. The later approach will result in a first concentration of the additive in the deposited layer of material in a first region 42, a transition in the concentration of the additive over the depth of a second region 44, and essentially zero concentration of the additive in a third region 46. Alternatively, the concentration of an additive in the solution 34 may be gradually increased during the plating process, resulting in a gradual increase in the concentration of the additive in layer 36 across its depth. Furthermore, a first additive may have its concentration increased across the depth of layer 36 while a second additive may have its concentration decreased across the same depth of layer 36.

Figure 4:
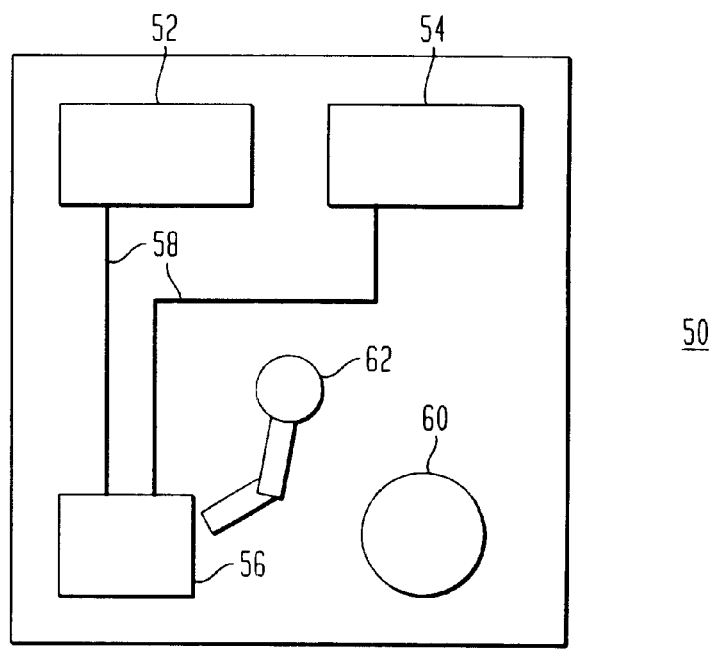
FIG. 4 is a plan view of a plating tool having two solution tanks feeding one bath.
Figure 5:
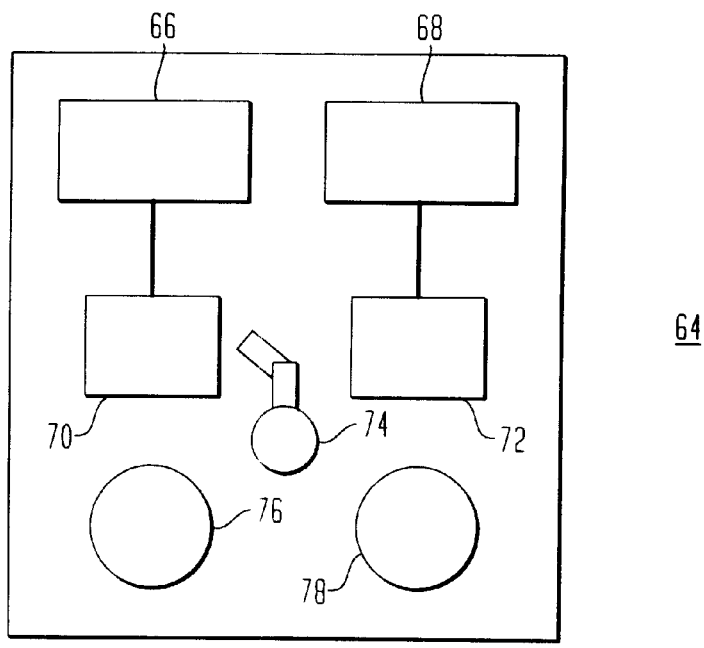
FIG. 5 is a plan view of a plating tool having two solution tanks feeding two baths.
Figure 6:
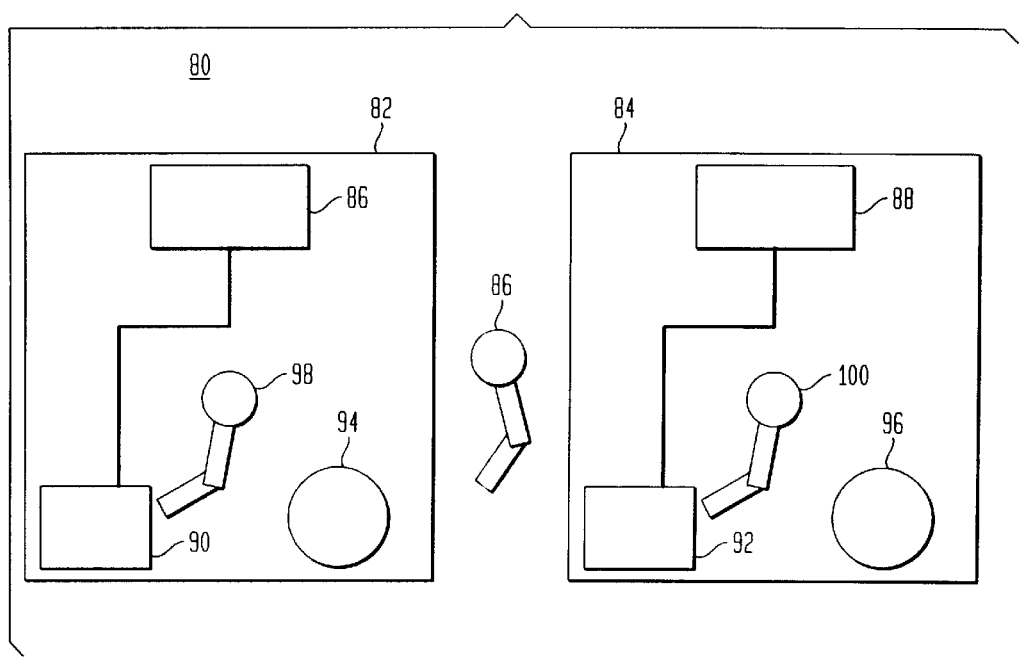
FIG. 6 is a plan view of two plating tools configured together with each tool including one solution tank and one bath.

FIGS. 4–6 illustrate alternative embodiments of plating equipment for depositing a metal layer having a plurality of regions with differing chemistries. FIG. 4 illustrates a single plating tool 50 having two separate solution tanks 52, 54 containing two respective plating solutions having distinct chemistries. The two solution tanks 52, 54 are connected to a single bath 56 by an appropriate piping arrangement 58 that may include conduits, valves, and pumps as necessary for alternatively supplying bath 56 with consecutive volumes of the solution from either of the tanks 52, 54. Bath 56 may be any style known in the art, including horizontal or vertical configurations. Bath 56 is first filled with a first plating solution from tank 52 for the deposition of a first region of a layer of metal onto a wafer surface. The wafer may then be moved from the bath 56 to a cleaning device such as spin-rinse-dry cell 60 as is known in the art by a handling tool 62 where it is cleansed with de-ionized water and/or other chemicals and dried. The handling tool 62 may be a computer controlled automated machine or a manually controlled pick-and-place device as are known in the art. The first plating solution is drained from the bath 56 and preferably returned to tank 52, and the bath is filled with a second plating solution from tank 54. The wafer is returned to the bath 56 and a second region of the layer of metal is deposited. Depending upon the specific chemistries of the two plating solutions, one or more intermediate cleaning/flushing steps may be needed to remove the one solution from bath 56 before the second solution is introduced.

FIG. 5 illustrates a single plating tool 64 having two parallel plating trains including solution tanks 66, 68 connected to respective baths 70, 72. A first plating solution is contained in the first train 66, 70 and a second plating solution is contained in the second train 68, 72. A wafer is processed through the baths 70, 72 for the deposition of respective first and second regions of a layer of metal. Handling tool 74 is utilized to move the wafer between the baths 70, 72 and to spin-rinse-dry cells 76, 78 as appropriate.

FIG. 6 illustrates a plating assembly 80 including two separate plating tools 82, 84 configured together for the purpose of depositing two regions of a layer of metal onto a wafer surface. Handling tool 86 may be used to move wafers between the tools 82, 84. Each tool 82, 84 includes respective solution tanks 86, 88, baths 90, 92, spin-rinse-dry cells 94, 96 and handling tools 98, 100. A first region of a layer of metal is deposited onto a wafer surface in the first tool 82, then after appropriate cleaning and handling steps, a second region of the layer of metal having a distinct chemistry from the first region is deposited in tool 84.

One skilled in the art will appreciate that an electroless process may be used to deposit the layer of metal 36. Electroless plating uses a reduction reaction to deposit metal layer 36 without the use of an electric current. An electroless plating process can provide a uniform coating thickness over the entire surface of an irregularly shaped object. Electroless plating can also be used to deposit a conductive coating over a non-conductive surface. Electroless technologies involve the reduction of a complexed metal, such as copper or nickel for example, with formaldehyde in an alkaline solution. The reaction may be catalyzed by a palladium seed layer 32. As with the electroplating processes described above, the plating solution 34 used with an electroless process may be altered during the course of depositing metal layer 36 in order to produce a plurality of regions 42, 44, 46 having distinct chemical compositions. Expensive additives necessary in a final device may be eliminated from the electroless plating solution 34 once the thickness of the layer 36 completely fills the cavity 28 beyond a point where additional material will be removed by a later planarization step.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A microelectronic device at a stage of fabrication comprising:

a substrate having a surface;

a layer of metal comprising copper and an additive disposed on the substrate surface, the additive comprising at least one of the group of a carrier, a leveler and a surfactant; and wherein a concentration of the additive in the copper varies across a depth of the layer of metal.

2. The microelectronic device of claim 1, wherein the concentration of the additive in the copper is zero in an uppermost region of the layer of metal that will removed by a later planarization step.

3. The microelectronic device of claim 1, further comprising:

the substrate having a surface with a generally planar field and a cavity formed therein;

the layer of metal filling the cavity and extending above the generally planar field of the substrate surface; and an uppermost region of the layer of metal above the generally planar field of the substrate surface containing a zero concentration of the additive.

4. The microelectronic device of claim 1, further comprising:

the substrate having a surface with a generally planar field and a cavity formed therein;

the layer of metal filling the cavity and extending above the generally planar field of the substrate surface; and the additive being confined to within the cavity.

5. The microelectronic device of claim 1, further comprising:

the substrate having a surface with a generally planar field and a cavity formed therein;

the layer of metal filling the cavity and extending above the generally planar field of the substrate surface; and a non-zero concentration of the additive extending from the substrate surface to a level at least filling the cavity.

6. The microelectronic device of claim 1, further comprising:

a first region of the layer of metal comprising copper and a first concentration of the additive disposed on the substrate surface; and a second region of the layer of metal comprising copper and a second concentration of the additive less than the first concentration disposed on the first region.

7. The microelectronic device of claim 1, further comprising:

a first region of the layer of metal comprising copper and a first additive comprising at least one of the group of a carrier, a leveler and a surfactant disposed on the substrate surface; and a second region of the layer of metal comprising copper and a second additive comprising at least one of the group of a carrier, a leveler and a surfactant disposed on the first region, the second additive being different than the first additive.

8. The microelectronic device of claim 1, further comprising:

a first region of the layer of metal comprising copper and the additive at a first concentration;

a second region of the layer of metal comprising copper and the additive at a second concentration; and a third region of the layer of metal disposed between the first and the second regions and comprising copper and the additive at a concentration that varies across a thickness of the third region from the first concentration to the second concentration.

9. A microelectronic device at a stage of fabrication comprising:

a substrate having a surface defining a cavity;

a barrier layer formed on the surface in the cavity;

a bulk layer comprising a metal and an additive disposed on the barrier layer and at least filling the cavity, the additive comprising at least one of the group of a carrier, a leveler and a surfactant; and wherein a concentration of the additive in the metal varies gradually from a first concentration to a second concentration across a depth of the bulk layer.

10. The microelectronic device of claim 9, wherein the first concentration is zero and the second concentration is a non-zero value.

11. The microelectronic device of claim 9, wherein the concentration of the additive in the metal is zero at a depth in the bulk layer that is above a plane of the substrate surface outside the cavity.

12. The microelectronic device of claim 9, wherein the metal comprises one of the group of copper, nickel, lead, tin and gold.

* * * * *